United States Patent [19]
Przilas

[11] Patent Number: 5,255,738
[45] Date of Patent: Oct. 26, 1993

[54] TAPERED THERMAL SUBSTRATE FOR HEAT TRANSFER APPLICATIONS AND METHOD FOR MAKING SAME

[75] Inventor: Mark B. Przilas, Greenville, Tex.

[73] Assignee: E-Systems, Inc., Dallas, Tex.

[21] Appl. No.: 915,460

[22] Filed: Jul. 16, 1992

[51] Int. Cl.⁵ .................................... F28F 7/00
[52] U.S. Cl. .......................... 165/185; 165/905; 361/701; 361/702
[58] Field of Search ............ 165/185, 905; 361/386, 361/388

[56] References Cited

U.S. PATENT DOCUMENTS

| | | | |
|---|---|---|---|
| 3,543,842 | 12/1970 | Merges | 165/185 |
| 3,913,666 | 10/1975 | Bayliss | 165/185 |
| 4,278,707 | 7/1981 | Biran | 427/96 |
| 4,689,110 | 8/1987 | Leibowitz | 361/388 |
| 4,849,858 | 7/1989 | Grapes et al. | 361/388 |
| 4,867,235 | 9/1989 | Grapes et al. | 165/185 |
| 4,878,152 | 10/1989 | Sauzade et al. | 361/386 |
| 4,963,414 | 10/1990 | LeVasseur et al. | 428/195 |
| 4,966,226 | 10/1990 | Hamburgen | 165/104.26 |
| 4,987,425 | 1/1991 | Zahn et al. | 361/388 |
| 5,039,577 | 8/1991 | Knoell et al. | 361/388 |
| 5,077,637 | 12/1991 | Martorana et al. | 165/185 |
| 5,111,359 | 5/1992 | Montesano | 361/388 |
| 5,113,315 | 5/1992 | Capp et al. | 165/185 |

*Primary Examiner*—John Rivell
*Assistant Examiner*—L. R. Leo
*Attorney, Agent, or Firm*—Harold E. Meier

[57] ABSTRACT

A tapered thermal substrate for transferring heat generated from a heat source to a heat sink comprising a composite core of parallel layers of thermally conductive fibers, the core having a tapered edge that maximizes fiber end exposure to the heat source or sink. The tapered edge is comprised of at least one angled surface formed by machining the composite core. A copper thermal tab is plated to each angled surface and machined to a desired size and shape to provide a contact surface for the heat source or sink and a means for facilitating transfer of generated heat to and from the fiber ends. A flashing of a thin coating of copper and nickel over the composite core and each copper thermal tab is also provided to environmentally seal the composite core.

16 Claims, 5 Drawing Sheets

TAPERED THERMAL SUBSTRATE FOR HEAT TRANSFER APPLICATIONS AND METHOD FOR MAKING SAME

TECHNICAL FIELD

The present invention relates to transferring thermal energy and, in particular, to an improved substrate for transferring the thermal energy generated by a heat source to a heat sink for dissipation.

BACKGROUND OF THE INVENTION

The use of thermally conductive cores for transfer of heat generated by a heat source to a heat sink is well known in the art. Such cores have historically been comprised of relatively high thermal conductivity metals such as copper or aluminum. Unfortunately, these high thermal conductivity metals also have high thermal coefficients of expansion that adversely affect their permissible applications. For example, if a copper or aluminum thermal core is mounted to a printed circuit board to transfer the heat generated by attached circuit components to a heat sink for dissipation, the expansion and contraction of the core due to thermal changes in the transferred heat tends to warp the circuit board resulting in fatigue and failure of solder joints and/or cracking of the board substrate. In other applications, the use of copper or aluminum as a thermal transfer means is not permitted because cores manufactured from these metals tend to exceed maximum weight specifications.

One solution to the problem of thermal expansion and contraction has been to use low coefficient of thermal expansion metals such as invar, kovar and/or molybdenum in conjunction with copper or aluminum. By layering or laminating the invar, kovar or molybdenum with the copper or aluminum, the low coefficient metals tend to control the thermal expansion and contraction difficulties experienced with the high coefficient metals, producing a more thermally stable core. Unfortunately, the use of these low coefficient of thermal expansion metals adversely affects the overall thermal conductivity performance of the laminated or layered core in comparison to a conventional copper or aluminum core. Furthermore, these layered or laminated cores suffer from the same weight concerns experienced with copper or aluminum cores and are therefore not favored in airborne and aerospace applications.

The most recent evolutionary step in thermal core construction techniques has been the use of fiber reinforced composites that possess the benefit of being highly thermally conductive (two to three times greater than copper) while simultaneously being relatively lightweight in comparison to conventional cores. Several drawbacks with composite cores have been noted. The fibers used in composite cores are highly thermally conductive in the direction along their length but exhibit poor thermal conduction characteristics orthogonal to the direction of each fiber. Furthermore, the binder used to secure the fibers together in the core possesses relatively low thermal conductivity characteristics. Thus, composite cores inefficiently conduct generated heat transverse to the fiber direction. For most efficient operation of the composite fiber core, the fiber ends must be placed adjacent to the heat source or sink.

Two methods have been employed to bring the fiber ends adjacent the source or sink. First, as disclosed in U.S. Pat. Nos. 4,867,235 and 4,849,858, issued to Grapes, et al., the composite core is bent such that the fiber ends are inclined with respect to the core surface to facilitate placement of the fiber ends adjacent the source or sink. This core construction method is not preferred because bending of the composite core is expensive and may result in breakage of the fibers and/or damage to the structural integrity of the composite core. A second construction method, disclosed in U.S. Pat. No. 5,111,359, issued to Montesano and assigned to the assignee of this application for patent, requires the machining of the core to form an opening (exposing the fibers therein) having a precise shape for receiving and adhesively mounting a thermally conductive wedge. The drawbacks experienced with this fabrication method are increased costs due to the precise tolerances required to mate the wedge to the opening and inefficiencies in heat transfer between the fibers and the inserted wedge resulting from the adhesive mounting of the wedge. Accordingly, there is a need for an improved thermal transfer substrate design that is less expensive to manufacture and more efficient to operate than known prior art substrates.

SUMMARY OF THE INVENTION

The tapered thermal substrate of the present invention comprises a composite core of parallel layers of thermally conductive fibers wherein the core is tapered to a shape that maximizes fiber end exposure for transferring thermal energy between the ends of fibers and a heat source or sink positioned nearby. The tapered thermal substrate further includes a thick copper thermal conductor plated to the core at tapered locations to form a thermal tab that provides a contact surface for a nearby heat source or sink and a means for facilitating transfer of heat between the source or sink and the fiber ends. Furthermore, for environmental concerns, the fiber core and thermal tab of the tapered thermal substrate of the present invention are flashed with a thin coating of copper and nickel.

BRIEF DESCRIPTION OF THE DRAWINGS

A more complete understanding of the tapered thermal substrate of the present invention may be had by reference to the following Detailed Description when taken in conjunction with the accompanying Drawings wherein.

DETAILED DESCRIPTION OF THE DRAWINGS

Figure 1:
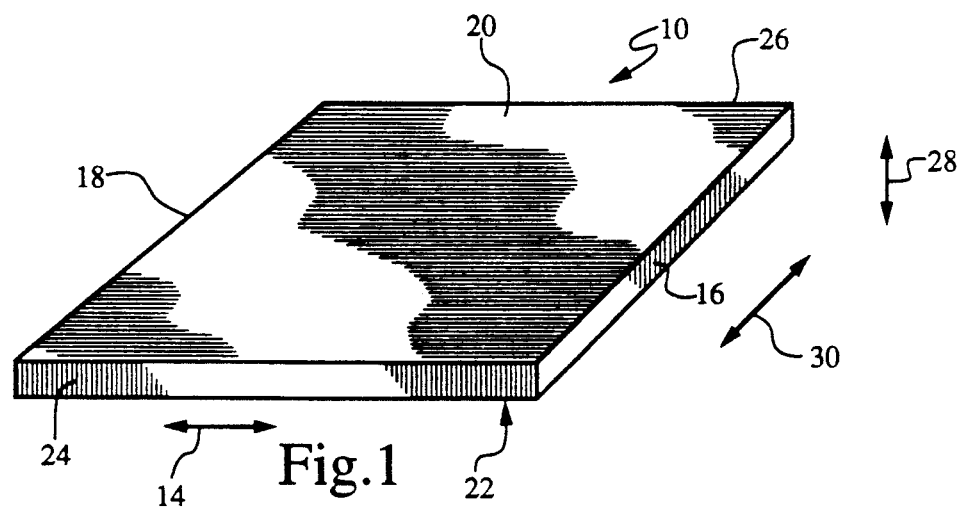
FIG. 1 is a perspective view of a core sheet stock of a thermally conductive fiber composite material.
Figure 4A:
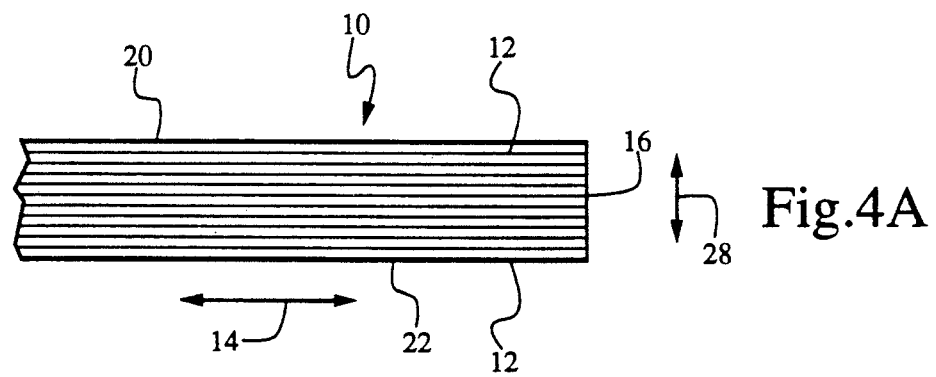
FIGS. 4A–4I are cross-sectional views illustrating the fabrication steps of the tapered thermal substrate of the present invention.

Referring now to FIGS. 1 and 4A, there is shown, in perspective and cross-sectional views, respectively, a stock fiber composite core 10 comprised of a plurality of parallel layers 12 of thermally conductive "pitch" type fibers in a matrix material (not shown). For example, the fiber layers 12 of the stock core 10 may comprise P100, P120 or K1100 THORNEL graphite fibers (manufactured by the Amoco Advanced Composites Corporation) and the matrix material may comprise an epoxy resin. It will, of course, be understood that any equivalently performing thermally conductive fiber or matrix material may be used for the composite sheet stock core 10. The fibers within each layer 12 are substantially oriented in a single direction (generally indicated by arrow 14) extending between a first end (or edge) 16 and a second end (or edge) 18 that correspond to a thermal input and/or thermal output location. The core 10 further includes a top and bottom surface, 20 and 22, respectively, and opposed side edges 24 and 26. The thermal conductivity of the core 10 is high in the direction of the fibers (see arrow 14), but is low in directions transverse thereto (see directions indicated by the arrows 28 and 30 orthogonal to the direction 14). In an effort to control thermal expansion of the composite core 10, the fibers within some layers 12 of the composite core may be oriented in the direction indicated by arrow 30 or at any other selected angle between the zero degree angle of arrow 14 and the ninety degree angle of arrow 30.

Figure 2:
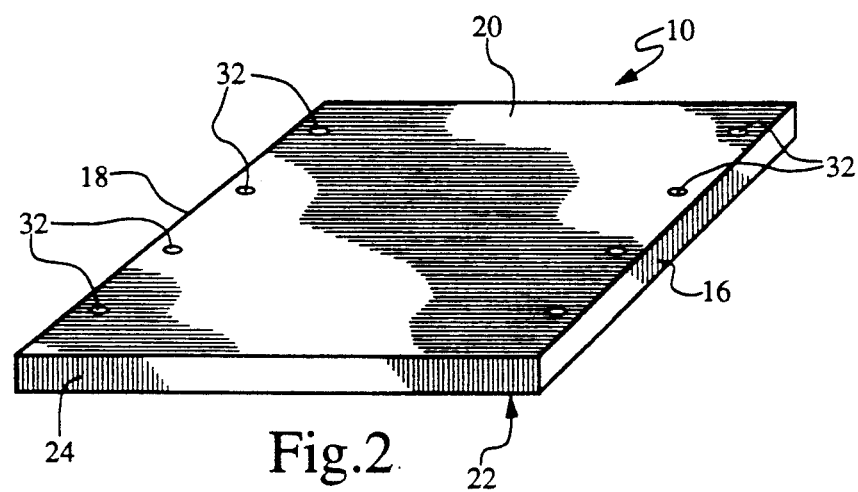
FIG. 2 is a perspective view of the core sheet stock with filler holes drilled in the ends thereof.
Figure 3:
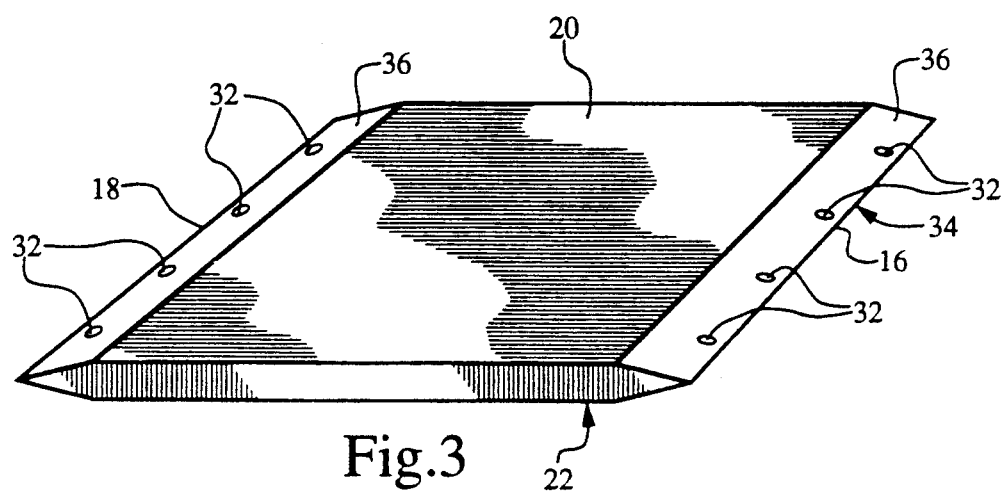
FIG. 3 is a perspective view of the core sheet stock following machining of the core ends to a tapered edge.
Figure 4B:
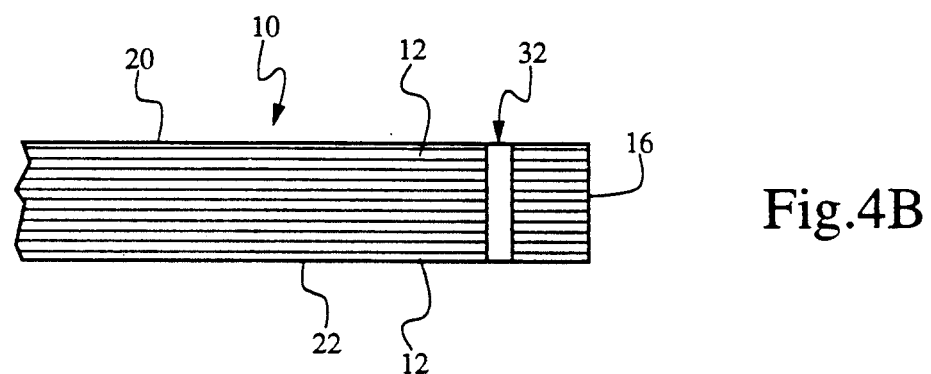
Figure 4C:
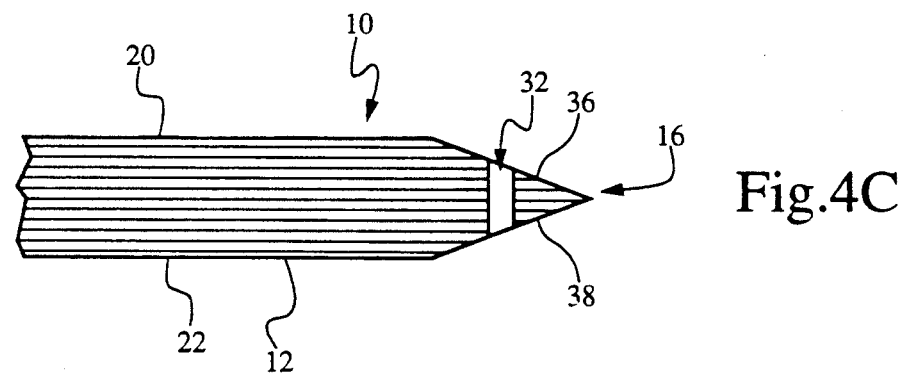
Figure 5A:
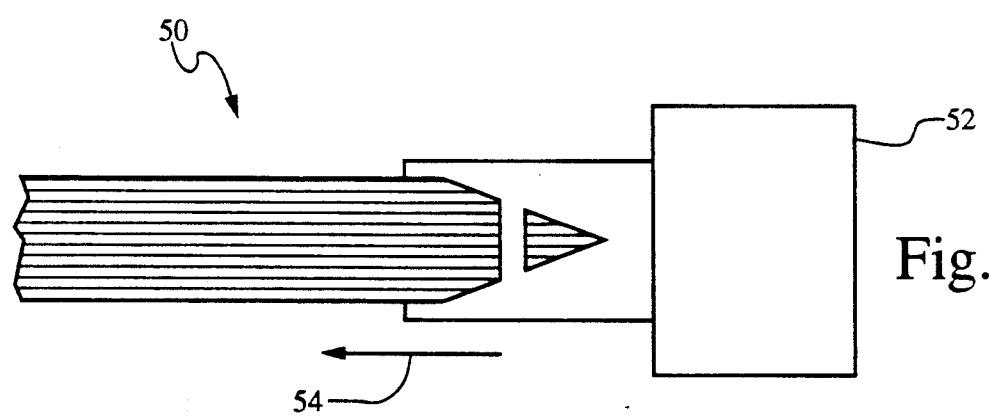
FIGS. 5A–5F are cross-sectional views illustrating several different embodiments of the tapered thermal substrate of the present invention fabricated substantially in accordance with steps illustrated in FIGS. 4A–4I.
Figure 5B:
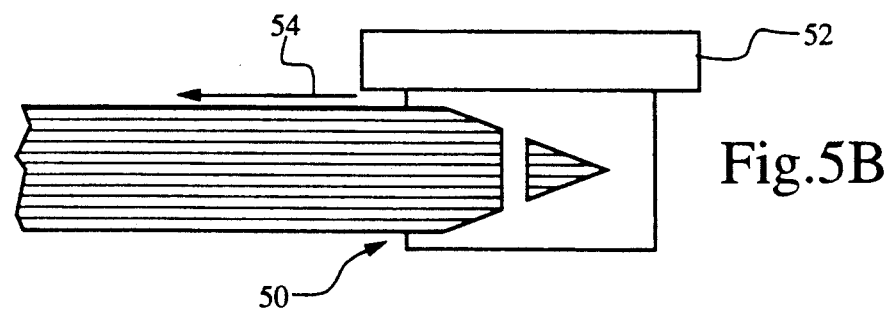
Figure 5C:
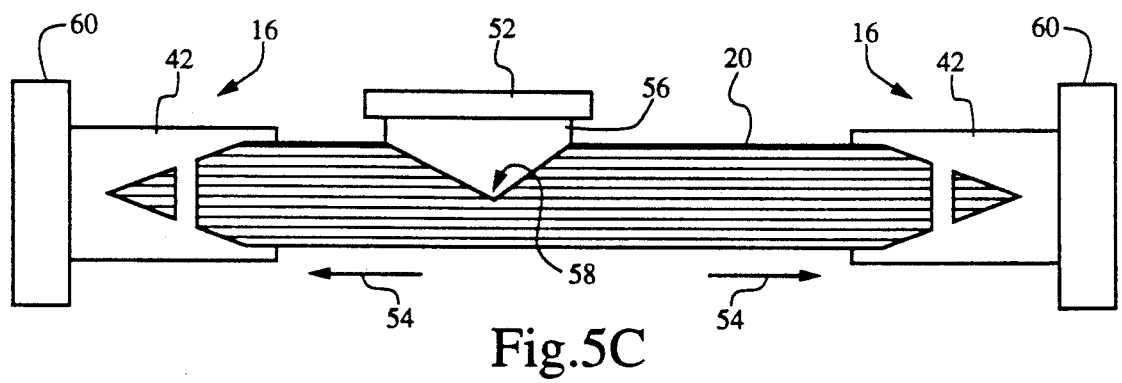
Figure 5D:
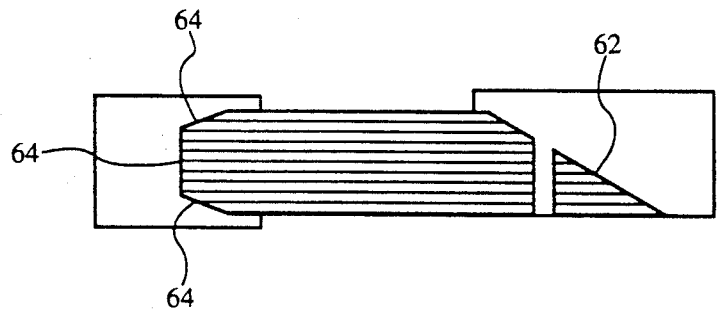

Referring now to FIGS. 2 and 4B, there is shown, in perspective and cross-sectional views, respectively, the fiber composite core 10 with a plurality of filler holes 32 drilled through the core from the top surface 20 to the bottom surface 22 adjacent the first end 16 and second end 18. Referring now to FIGS. 3 and 4C, the first end 16 and second end 18 of the core 10 are machined, preferably from both the top and bottom core surfaces, 20 and 22, respectively, to form a tapered edge 34 comprised of a top angled surface 36 and a bottom angled surface 38. The filler holes 32 function to distribute the forces generated on the core 10 during the step of machining the thermal substrate. The angled surfaces 36 and 38 expose the ends of the fibers of the layers 12 comprising the composite core 10 oriented in the direction of the arrow 14 to facilitate, in a manner to be described, the transfer of generated heat between the core and nearby heat sources or sinks. It will, of course, be understood that the machining of the core 10 may form as few as one or more than two angled surfaces (see FIG. 5D), as desired, without substantially affecting manufacturing cost or performance.

Figure 4D:
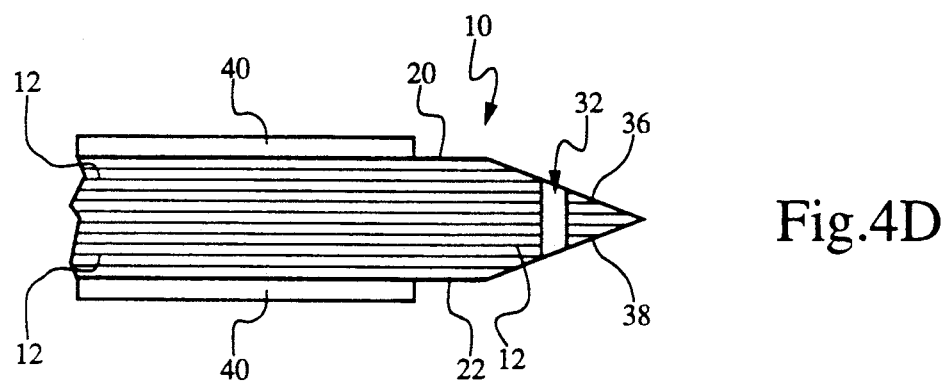
Figure 4E:
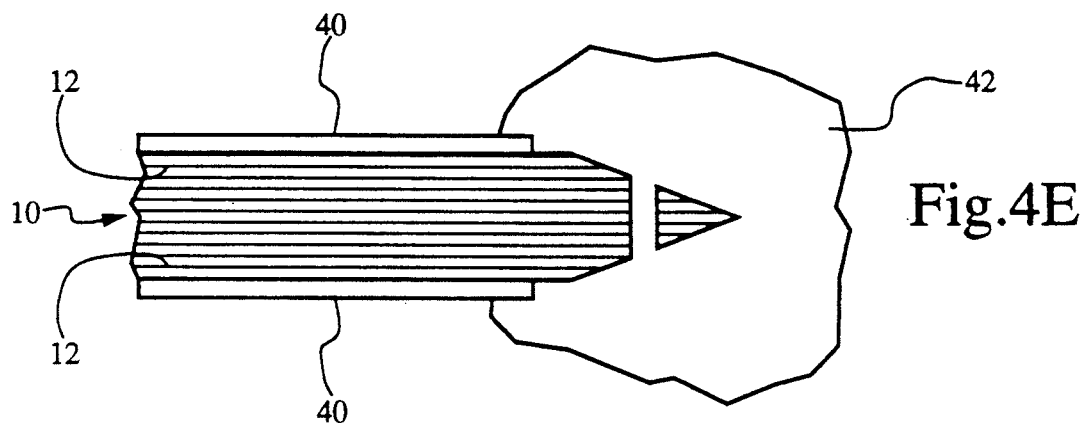
Figure 4F:
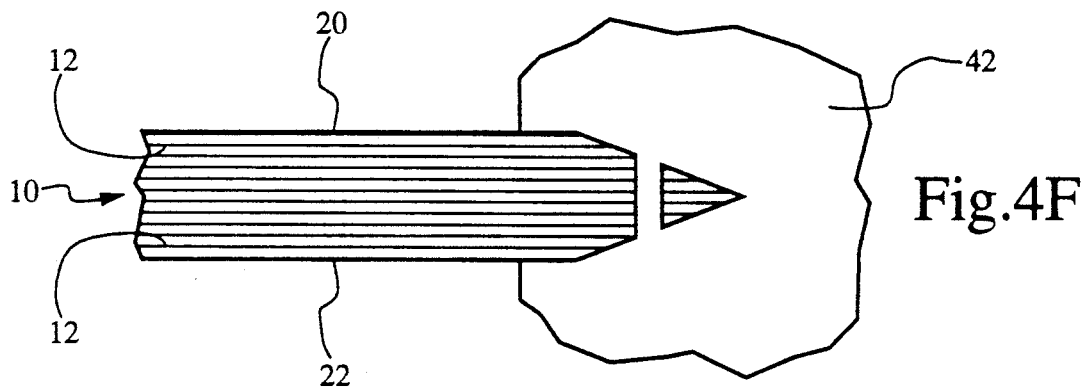
Figure 4G:
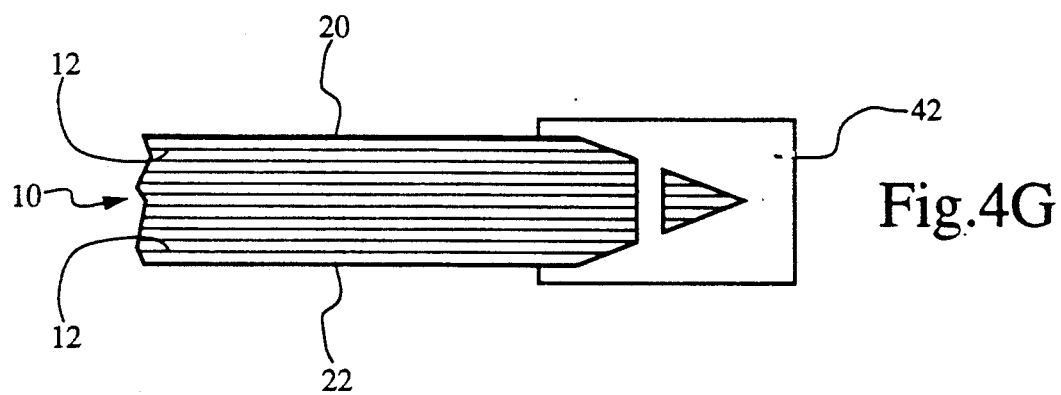
Figure 4H:
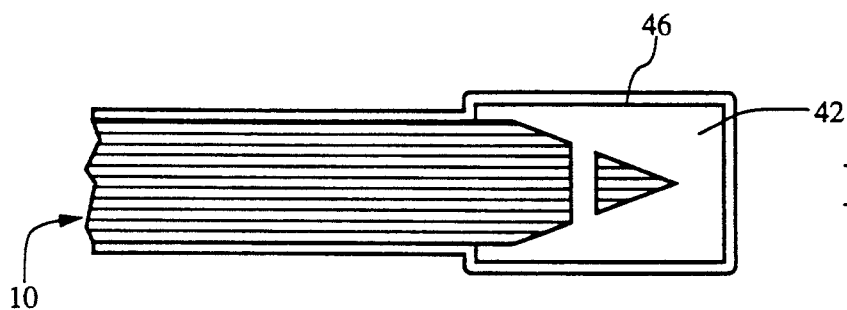
Figure 4I:
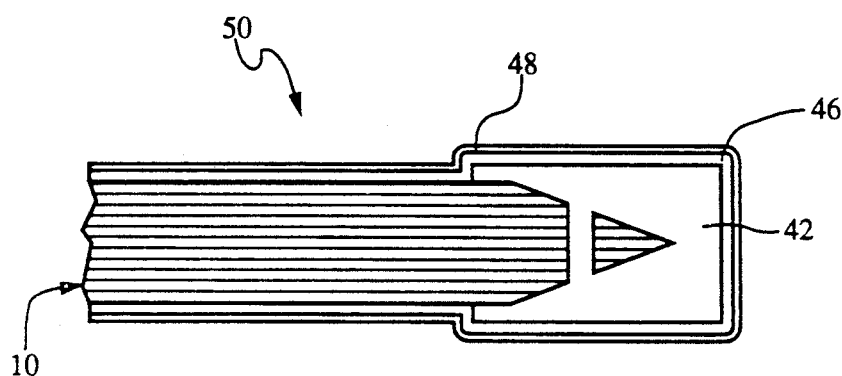

Referring now to the cross-sectional view shown in FIG. 4D, following machining of the core 10, a mask 40 is applied over the top and bottom surfaces, 20 and 22, respectively, leaving only the top angled surface 36 and bottom angled surface 38 exposed. Referring now to FIG. 4E, a copper conductor is plated (deposited) over the core 10 and attached to the angled surfaces 36 and 38 to form a thermal tab 42 in thermal connection with the fiber ends. The filler holes 32 are filled with the plated copper and function as anchors securing the physical connection of the thermal tab 42 to the core 10. The mask 40 is then removed as shown in FIG. 4F and the attached thermal tab 42 is machined to a desired shape and thickness as shown in FIG. 4G for facilitating a thermal connection with the nearby heat sink or source. Referring now to FIGS. 4H and 4I, the core 10 and thermal tab 42 are then flashed with thin coatings of copper 46 and nickel 48 to complete fabrication of the tapered thermal substrate 50 of the present invention. The copper and nickel flashed coatings, 46 and 48, are shown exaggerated in size in FIGS. 4H and 4I and function to provide an environmental seal for the thermal substrate 50.

Figure 5E:
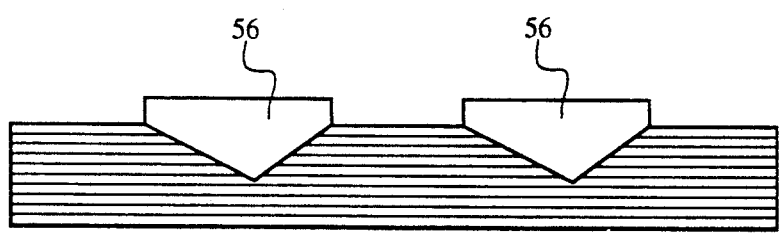
Figure 5F:
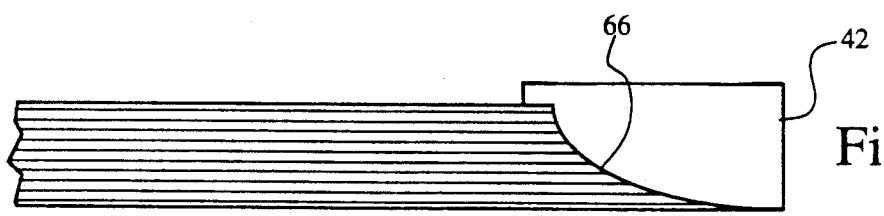

Referring now to FIGS. 5A–5F, there are shown several cross-sectional views illustrating different configurations of the tapered thermal substrate 50 of the present invention. It will, of course, be understood these examples are by way of illustration and not limitation. With specific reference to FIGS. 5A and 5B, two adjacent positioning locations for a heat source (or sink) 52 are shown for the configuration of the tapered thermal substrate 50 shown in FIG. 4I. The generated heat is transferred, for example, by the fibers 12 from the heat source 52 in the direction shown by the arrow 54. The heat source 52 may also be positioned, in the manner illustrated by FIG. 5C, between the first and second ends, 16 and 18, respectively, of the core 10, adjacent an interior thermal tab 56 that is plated in a channel 58 machined in the top surface 20. Following plating, the interior thermal tab 56 is machined to the size and shape required for thermal connection with the heat source 52. A heat sink 60 is shown positioned adjacent the edge thermal tabs 42 plated to the first and second ends of the core 10 to dissipate the heat transferred (in the direction shown by the arrow 54) from the heat source 52 by the tapered thermal substrate 50. It will, of course, be understood that the end of the core 10 (or any other core position) may be tapered to an edge having only a single angled surface 62, or more than two surfaces 64, in the manner illustrated by FIG. 5D. Furthermore, the position of the thermal tabs for thermal input and thermal output need not be at edges of the core 10, but may both be internal, as shown in FIG. 5E, if required by the application. Finally, the angled surface may alternatively comprise surface 66 having a curved shape to form the tapered edge as shown in FIG. 5F.

Although several embodiments of the tapered thermal substrate of the present invention have been described in the foregoing Detailed Description and illustrated in the accompanying Drawings, it will be understood that the elements and manufacturing steps are capable of numerous modifications and substitutions without departing from the scope of the invention.

I claim:

1. Apparatus for thermal transfer comprising:
   an elongated composite core including a plurality of thermally conductive fibers oriented along a length of the core and terminating at a fiber end having a tapered shape exposing the thermally conductive fibers; and
   a thermally conductive metal plating shaped to form a thermal tab anchored to the composite core and in thermal connection with the exposed conductive fibers of the core of the fiber end; and
   the composite core having at least one filler hole adjacent the fiber end for receiving the metal plating and anchoring the thermal tab to the composite core.

2. The apparatus for thermal transfer as in claim 1 wherein the thermally conductive fibers comprise "pitch" type fibers.

3. The apparatus for thermal transfer as in claim 1 wherein the thermally conductive metal plating comprises a copper plating, the thermal tab having a machined size and shape selected for facilitating thermal connection with an external heat conductor.

4. The apparatus for thermal transfer as in claim 3 wherein the external heat conductor comprises either a heat source or heat sink.

5. The apparatus for thermal transfer as in claim 1 wherein the fiber end having the tapered shape is located at an edge of the composite core.

6. The apparatus for thermal transfer as in claim 1 wherein the fiber end having the tapered shape is located at an interior position of the composite core.

7. The apparatus for thermal transfer as in claim 1 further including a plurality of thermally conductive fibers oriented at an angle from the plurality of fibers oriented along the length of the core.

8. Apparatus for thermal transfer comprising:
   an elongated composite core including a plurality of thermally conductive fibers oriented along a length of the core and terminating at a fiber end having a tapered shape exposing the thermally conductive fibers; and
   a thermally conductive metal plating shaped to form a thermal tab in physical connection with the composite core and in thermal connection with the exposed conductive fibers of the core at the fiber end; and
   a thermally conductive metal coating flashed over the elongated composite core and each included thermal tab.

9. The apparatus for thermal transfer as in claim 8 wherein the thermally conductive metal coating comprises multiple layered coatings of the same or a different thermally conductive metal.

10. A method for making an apparatus for thermal transfer comprising the steps of:
    forming an elongated composite core at a thermal connection location to a tapered shape, the core comprising a plurality of thermally conductive fibers oriented along a length of the core, the tapered shape having at least one angled surface that exposes a plurality of thermally conductive fiber ends;
    forming a plurality of filler holes in the elongated composite core adjacent the thermal connection location; and
    plating a thermally conductive metal over each included angled surface at the thermal connection location to form a thermal tab and filling the holes with the thermally conductive metal to anchor the thermal tab to the composite core and in thermal connection with the exposed ends of the plurality of conductive fibers of the core.

11. The method for making an apparatus for thermal transfer as in claim 10 further including the step of masking the elongated composite core prior to the step of plating to leave each included angled surface exposed for plating of the thermally conductive metal.

12. A method for making an apparatus for thermal transfer comprising the steps of:
    forming an elongated composite core of a thermal connection location to a tapered shape, the core comprising a plurality of thermally conductive fibers oriented along a length of the core, the tapered shape having at least one angled surface that exposes a plurality of thermally conductive fiber ends;
    plating a thermally conductive metal over each included angled surface at the thermal connection location to form a thermal tab in physical connection with the composite core and in thermal connection with the exposed ends of the plurality of conductive fibers of the core; and
    flashing a coating of a thermally conductive metal over the elongated composite core and each included plated thermal tab.

13. The method for making an apparatus for thermal transfer as in claim 12 wherein the step of flashing comprises the
    step of flashing multiple layered coatings of the same of a different thermally conductive metal.

14. Apparatus for thermal transfer, comprising:
    an elongated composite core having a thermal input section and a thermal output section including a plurality of thermally conductive fibers oriented substantially in a direction extending between the input section and the output section, the core having a tapered shape at both the input and the output sections, the tapered shape including at least one angled surface exposing the thermally conductive fibers extending between the input section and the output section;
    a thermally conductive metal plating over each included angled surface anchored to the core and in thermal connection with the exposed thermally conductive fibers, the plating shaped to form a thermal input tab at the input section and a thermal output tab at the output section, the fibers transferring heat along the core between the thermal input tab and the thermal output tab; and
    the composite core at the input section and at the output section has at least one filler hole adjacent the exposed thermally conductive fibers for receiving the metal plating and anchoring the thermal input tab to the input section and the thermal output tab to the output section of the composite core.

15. Apparatus for thermal transfer, comprising:
    an elongated composite core having a thermal input section and a thermal output section including a plurality of thermally conductive fibers orientated substantially in a direction extending between the input section and the output section, the core having a tapered shape at both the input and the output sections, the tapered shape including at least one angled surface exposing the thermally conductive fibers extending between the input section and the output section;
    a thermally conductive metal plating over each included angled surface in physical connection with the core and in thermal connection with the exposed thermally conductive fibers, the plating shaped to form a thermal input tab at the input section and a thermal output tab at the output section, the fibers transferring heat along the core between the thermal input tab and the thermal output tab; and
    a thermally conductive metal coating flashed over the elongated composite core, the input thermal tab and the output thermal tab.

16. The apparatus for thermal transfer as in claim 15 wherein the thermally conductive metal coating flashed over the elongated composite core, the input thermal tab and the output thermal tab comprises multiple layered coatings of the same or a different thermally conductive metal.

* * * * *